(12) United States Patent
Lin et al.

(10) Patent No.: US 6,849,894 B2
(45) Date of Patent: Feb. 1, 2005

(54) SEMICONDUCTOR DEVICE WITH TRANSISTOR AND CAPACITOR AND ITS MANUFACTURE METHOD

(75) Inventors: Jun Lin, Kawasaki (JP); Toshiya Suzuki, Kawasaki (JP); Katsuhiko Hieda, Yokohama (JP)

(73) Assignees: Fujitsu Limited, Kawasaki (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/317,063

(22) Filed: Dec. 12, 2002

(65) Prior Publication Data

US 2004/0012047 A1 Jan. 22, 2004

(30) Foreign Application Priority Data

Jul. 19, 2002 (JP) ......................................... 2002-211020

(51) Int. Cl.[7] ............................................... H01L 29/94
(52) U.S. Cl. ...................... 257/304; 257/296; 257/303; 257/306; 257/310; 257/311; 438/238; 438/239; 438/386; 438/399
(58) Field of Search ................................. 257/296, 303, 257/304, 306, 310, 311; 438/238, 239, 244, 386, 399, 253, 287, 396

(56) References Cited

U.S. PATENT DOCUMENTS 6,188,098 B1   2/2001   Amanuma .................. 257/306
6,465,370 B1 * 10/2002   Schrems et al. ............ 438/783
6,605,835 B2 *  8/2003   Lee ............................. 257/295

OTHER PUBLICATIONS

Wolf, "Silicon Processing for the VLSI Era", Lattice Press, vol. 2, pp. 434–435.*

Office Action dated Mar. 25, 2004 for the corresponding Taiwan patent application.

* cited by examiner

Primary Examiner—Nathan J. Flynn
Assistant Examiner—Scott R. Wilson
(74) Attorney, Agent, or Firm—Westerman, Hattori, Daniels & Adrian, LLP

(57) ABSTRACT

On a semiconductor substrate, a transistor and a capacitor electrically connected to the transistor are formed, the capacitor having two electrodes made of metal and a capacitor dielectric layer between the two electrodes made of oxide dielectric material. A temporary protective film is formed over the capacitor, the temporary protective film covering the capacitor. The semiconductor substrate with the temporary protective film is subjected to a heat treatment in a reducing atmosphere. The temporary protective film is removed. The semiconductor substrate with the temporary protective film removed is subjected to a heat treatment in an inert gas atmosphere or in a vacuum state. A protective film is formed over the capacitor, the protective film covering the capacitor. With these processes, leak current of the capacitor can be reduced.

6 Claims, 9 Drawing Sheets

SEMICONDUCTOR DEVICE WITH TRANSISTOR AND CAPACITOR AND ITS MANUFACTURE METHOD

CROSS REFERENCE TO RELATED APPLICATION

This application is based on Japanese Patent Application No. 2002-211020, filed on Jul. 19, 2002, the entire contents of which are incorporated herein by reference.

BACKGROUND OF THE INVENTION

1) Field of the Invention

The present invention relates to a semiconductor device and its manufacture method, and more particularly to a semiconductor device having transistors and capacitors connected to the transistors and its manufacture method, the capacitor being made of a lamination of a metal film, a dielectric film and a metal film sequentially stacked in this order.

2) Description of the Related Art

A capacitor is used as a memory element of a dynamic random access memory (DRAM). The performance of a memory element can be improved by improving the performance of a capacitor. It becomes easy to make DRAM compact if a capacitor is made of a capacitor dielectric layer having a high dielectric constant.

$Ta_2O_5$ is known as oxide dielectric material having a high dielectric constant. If a $Ta_2O_5$ film is used as the capacitor dielectric layer, leak current can be reduced. If a $Ta_2O_5$ film is formed by chemical vapor deposition (CVD), good step coverage can be realized.

If an oxide dielectric material layer having a high dielectric constant is used as a capacitor dielectric layer, it is desired that the lower and upper electrodes of the capacitor are made of metal which is not oxidized or remains conductor even if it is oxidized. Such electrode material facilitates to form a capacitor having good electrical characteristics. Rare metal which contains noble metal such as Ru and Pt is known as the material not oxidized or maintaining conductivity even if it is oxidized. Good step coverage can be realized if a Ru film is formed by CVD.

DRAM manufacture processes can be classified into a process of forming a transistor, a process of forming a wiring layer between a transistor and a capacitor, a process of forming a capacitor, a process of forming a wiring layer and a protective film on and over the capacitor, and a heat treatment for recovering the transistor performance. The heat treatment for recovering the transistor performance is performed in a hydrogen atmosphere. It has been found that if a heat treatment is performed in a hydrogen atmosphere, the electrical characteristics of a capacitor having a $Ru/Ta_2O_5/Ru$ structure are degraded although the transistor performance is recovered.

The capacitor electrical characteristics can be recovered by performing a heat treatment for recovering the capacitor electrical characteristics at about 400° C. before a protective film of silicon nitride is formed. It is difficult to reduce leak current of a capacitor by a heat treatment after the protective film is formed.

SUMMARY OF THE INVENTION

An object of this invention is to provide a semiconductor device manufacture method capable of reducing leak current of a capacitor.

Another object of the invention is to provide a semiconductor device with reduced leak current of a capacitor.

According to one aspect of the present invention, there is provided a semiconductor device comprising: a transistor formed on a semiconductor substrate; a capacitor electrically connected to said transistor, said capacitor having two electrodes consisting of metal and a capacitor dielectric layer between the two electrodes consisting of oxide dielectric material; an interlayer insulating film formed on or over said capacitor and having a hydrogen concentration gradually lowering at positions remoter from said semiconductor substrate; and a protective film formed on or over said interlayer insulating film.

According to another aspect of the present invention, there is provided a method of manufacturing a semiconductor device, comprising the steps of: (a) forming a transistor and a capacitor electrically connected to the transistor on a semiconductor substrate, the capacitor having two electrodes consisting of metal and a capacitor dielectric layer between the two electrodes consisting of oxide dielectric material; (b) forming a temporary protective film on or over the capacitor, the temporary protective film covering the capacitor; (c) subjecting the semiconductor substrate with the temporary protective film to a heat treatment in a reducing atmosphere; (d) removing the temporary protective film; (e) subjecting the semiconductor substrate without the temporary protective film to a heat treatment in an inert gas atmosphere or in a vacuum state; and (f) forming a protective film on or over the capacitor, the protective film covering the capacitor.

The heat treatment at the step (c) improves the characteristics of the transistor formed on the semiconductor substrate. This heat treatment may increase leak current of the capacitor. Leak current of the capacitor can be reduced by performing the heat treatment at the step (e) after the temporary protective film is removed.

According to another aspect of the present invention, there is provided a method of manufacturing a semiconductor device, comprising the steps of: forming a transistor and a capacitor electrically connected to the transistor on a semiconductor substrate, the capacitor having two electrodes consisting of metal and a capacitor dielectric layer between the two electrodes consisting of oxide dielectric material; forming a protective film on or over the capacitor, the temporary protective film covering the capacitor; subjecting the semiconductor substrate with the protective film to a heat treatment in a reducing atmosphere; heating the protective film with a flash lamp to eliminate hydrogen contained in the protective film; and subjecting the semiconductor substrate with the protective film after hydrogen elimination to a heat treatment in an inert gas atmosphere or in a vacuum state.

The transistor characteristics can be improved by the heat treatment in the reducing atmosphere. Leak current of the capacitor may be increased by this heat treatment. Leak current of the capacitor can be reduced by performing the heat treatment after hydrogen is eliminated from the protective film.

According to another aspect of the present invention, there is provided a method of manufacturing a semiconductor device, comprising the steps of: forming a transistor and a capacitor electrically connected to the transistor on a semiconductor substrate, the capacitor having two electrodes consisting of metal and a capacitor dielectric layer between the two electrodes consisting of oxide dielectric material; forming a protective film on or over the capacitor, the temporary protective film covering the capacitor; subjecting the semiconductor substrate with the protective film to a heat treatment in a reducing atmosphere; forming a gettering film on the protective film, the gettering film consisting of material having hydrogen gettering ability; subjecting the semiconductor substrate with the gettering film; and removing the gettering film.

As the heat treatment is performed in the state that the gettering film is formed, hydrogen in the protective film is absorbed in the gettering film so that diffusion of hydrogen into the capacitor can be presented. The heat treatment can therefore improve the capacitor electrical characteristics.

According to a further aspect of the present invention, there is provided a method of manufacturing a semiconductor device, comprising the steps of: forming a transistor and a capacitor electrically connected to the transistor on a semiconductor substrate, the capacitor having two electrodes consisting of metal and a capacitor dielectric layer between the two electrodes consisting of oxide dielectric material; subjecting the semiconductor substrate with the transistor and capacitor to a heat treatment in a reducing atmosphere; subjecting the semiconductor substrate to a heat treatment in an inert gas atmosphere or in a vacuum state after the heat treatment in the reducing atmosphere; and forming a protective film on or over the capacitor, the protective film covering the capacitor.

Before the protective film is formed, the heat treatment in the reducing atmosphere and the heat treatment in the inert gas atmosphere or in the vacuum state are performed. Although the first heat treatment improves the transistor performance, leak current of the capacitor may be increased. The second heat treatment can reduce leak current of the capacitor.

As above, the capacitor electrical characteristics can be improved by performing the heat treatment under the conditions that hydrogen is hard to be supplied to the capacitor structure.

DESCRIPTION OF THE PREFERRED EMBODIMENTS

Figure 1A:
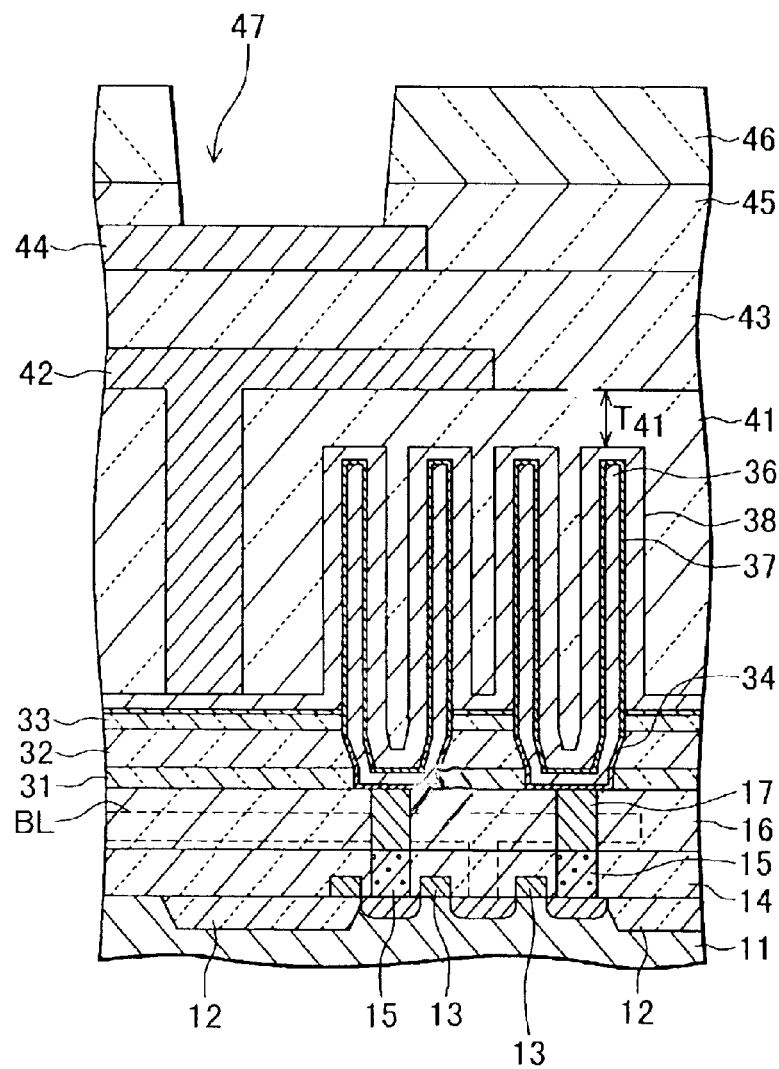
FIG. 1A is a cross sectional view of a DRAM manufactured by a semiconductor device manufacture method according to a first embodiment.

FIG. 1A is a cross sectional view of a DRAM manufactured by a semiconductor device manufacture method according to a first embodiment. With reference to FIG. 1A, the semiconductor device manufacture method of the embodiment will be described.

On the surface of a silicon substrate 11 having a p-type surfaces region, an isolation region 12 of silicon oxide ($SiO_2$) is formed by shallow trench isolation (STI). An insulated gate electrode 13 is formed on the surface of an active region defined by the isolation region 12.

Figure 1B:
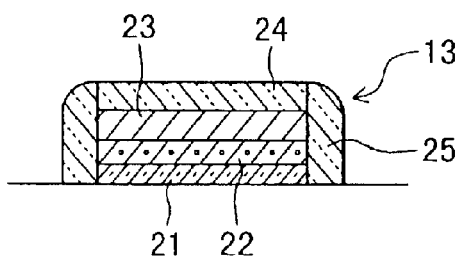
FIG. 1B is a cross sectional view of a gate electrode of DRAM.

As shown in FIG. 1B, the insulated gate electrode 13 has: a gate insulating film 21 of silicon oxide formed on the silicon surface; a lower gate electrode 22 of polysilicon formed on the gate insulating film; an upper gate electrode 23 of tungsten silicide (WSi) or the like formed on the lower gate electrode; an etching stopper layer 24 of silicon nitride (SiN) or the like formed on the upper gate electrode; and side wall etching stoppers 25 of silicon nitride or the like covering the side walls of the gate electrode. In FIG. 1A the insulated gate electrode 13 having a simplified structure is shown for the purposes of drawing simplification.

Before the sidewall etching stoppers 25 are formed, ion implantation is performed for forming source and drain regions by using as a mask the lamination structure from the gate insulating film 21 to etching stopper layer 24.

After the insulated gate electrode 13 is formed, a first interlayer insulating film 14 of silicon oxide or the like is formed. Contact holes are formed through the first interlayer insulating film 14 in necessary areas, and plugs 15 of polysilicon, tungsten or the like are filled in the contact holes. The plug 15 is formed by depositing a polysilicon or tungsten layer by CVD and removing unnecessary portions by chemical mechanical polishing (CMP) or the like.

A second interlayer insulating film 16 is thereafter formed on the substrate whole surface. The second interlayer insulating film 16 is formed by once depositing an insulating layer to an intermediate level, forming a bit line BL, and thereafter depositing the remaining insulating layer burying the bit line BL. Contact holes are formed through the second interlayer insulating film 16, reaching the lower plugs 15, and plugs 17 of tungsten or the like are buried in the contact holes.

For example, the plug 17 is formed through deposition of a blanket tungsten layer, CMP and the like. Thereafter, on the planarized surface of the second interlayer insulating film 16, a silicon nitride layer 31, a silicon oxide layer 32 and a silicon nitride layer 33 are sequentially deposited. A lamination structure of these layers is used as the base support member for preventing capacitors to be formed later from falling down. The upper and lower silicon nitride layers 31 and 33 function as the etching stopper when silicon oxide layers are etched.

A thick sacrificial film of silicon oxide or the like is formed on the silicon nitride layer 33, and openings are formed through the sacrificial film in the areas where cylinder type capacitors are to be formed. The surface of the plug 17 is exposed on the bottom of the opening. After the openings are formed, a titanium nitride (TiN) layer 34 and a ruthenium (Ru) layer 36 are deposited. The ruthenium layer and titanium nitride layer deposited on the upper surface of the sacrificial film are removed by CMP or the like. The lower electrode of the capacitor is formed in the above manner.

The sacrificial film is removed by wet etching using hydrofluoric acid solution or the like. During this removal process, the titanium nitride layer 34 is etched from the exposed portion down to the level deeper than the upper surface of the silicon nitride layer 33. Since the exposed titanium nitride layer 34 is removed, the outer wall of the ruthenium layer 36 is also exposed.

A tantalum oxide ($Ta_2O_5$) layer 37 of about 13 nm in thickness is formed on the exposed surface of the lower capacitor electrode by CVD at a substrate temperature of 400 to 500° C. using $Ta(O(C_2H_5))_5$ as source gas. The tantalum oxide layer 37 covers the whole surface of the ruthenium layer 36 including the surface where the titanium nitride layer 34 was retracted downward.

Covering the surface of the tantalum oxide layer 37, a ruthenium layer 38 of 30 nm in thickness is formed by CVD at a substrate temperature of 300 to 400° C. using $Ru(EtCP)_2$ or $Ru(CP)_2$ as source gas. In this manner, the capacitor structure is formed which is constituted of the ruthenium layer 36 as the lower electrode, the tantalum oxide layer 37 as the capacitor dielectric layer and the ruthenium layer 38 as the upper electrode.

A third interlayer insulating film 41 of silicon oxide is formed on the substrate whole surface, burying the capacitor structure. The thickness $T_{41}$ of the third interlayer insulating film 41 at the top of the ruthenium layer 38 is, for example, 300 nm. A contact hole is formed through the third interlayer insulating film 41 in a necessary area to partially expose the capacitor upper electrode ruthenium layer 38 on the bottom of the contact hole. The contact hole is formed in the area where the capacitor structure is not disposed.

A first layer aluminum wiring 42 of about 400 nm in thickness is formed on the third interlayer insulating film 41. This aluminum wiring 42 is connected via the contact hole in the third interlayer insulating film 41 to the ruthenium layer 38. A fourth interlayer insulating film 43 of silicon oxide about 450 nm in thickness is formed on the third interlayer insulating film 41, covering the aluminum wiring 42.

A second layer aluminum wiring 44 of about 900 nm in thickness is formed on the fourth interlayer insulating film 43. The aluminum wiring 44 is connected to a predetermined underlying wiring (not shown) via a contact hole (not shown) formed through the fourth interlayer insulating film 43.

Covering the aluminum wiring 44, a fifth interlayer insulating film 45 of silicon oxide about 300 nm in thickness is formed on the fourth interlayer insulating film 43. These interlayer insulating films of silicon oxide are formed, for example, by CVD. On the fifth interlayer insulating film 45, a protective film 46 of silicon nitride about 600 nm in thickness is formed. An opening 47 is formed through the two layers of the fifth interlayer insulating film 45 and protective film 46 to partially expose the aluminum wiring 44 on the bottom of the opening 47.

Figure 2A:
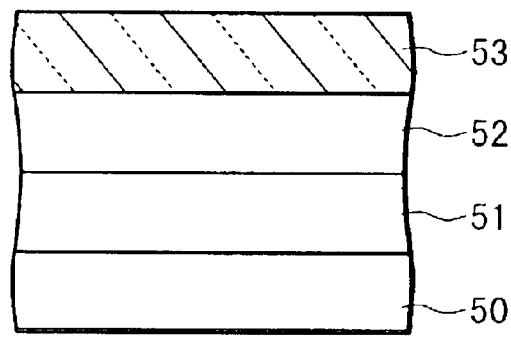
FIGS. 2A to 2C are schematic diagrams illustrating the semiconductor device manufacture method of the first embodiment.
Figure 2B:
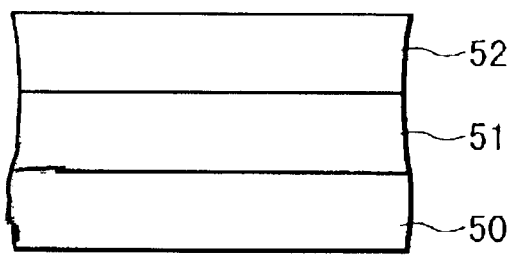
Figure 2C:
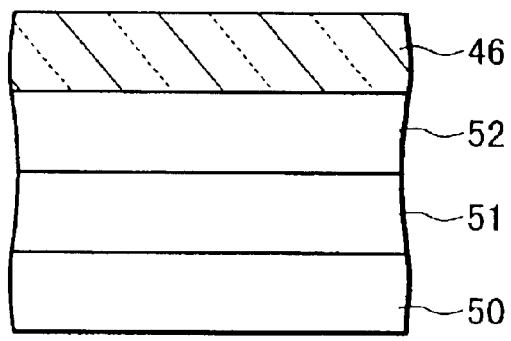

Next, with reference to FIGS. 2A to 2C, description is made on the manufacture processes after the fifth interlayer insulating film 45 is formed.

As shown in FIG. 2A, a capacitor layer 51 and a multi-wiring layer 52 are formed on a transistor layer 50. The transistor layer 50 corresponds to the lamination structure from the silicon substrate 11 to the second interlayer insulating film 16 shown in FIG. 1A. The capacitor layer 51 corresponds to the lamination structure from the silicon nitride film 31 to the ruthenium layer 38 shown in FIG. 1A. The multi-wiring layer 52 corresponds to the lamination structure from the third interlayer insulating film 41 to the fifth interlayer insulating film 45 shown in FIG. 1A.

A temporary protective film 53 of silicon nitride about 600 nm in thickness is formed on the multi-wiring layer 52 by CVD. In a reducing atmosphere of 10% hydrogen gas and 90% nitrogen gas, a heat treatment is performed for one hour at a temperature of 400 to 450° C. This heat treatment improves the characteristics of transistors formed in the transistor layer 50.

As shown in FIG. 2B, the temporary protective film 53 is removed, for example, by reactive ion etching (RIE) using mixture gas of $CF_4$, $O_2$ and $N_2$. The flow rates of $CF_4$, $O_2$ and $N_2$ are 140 sccm, 300 sccm and 40 sccm, respectively, the substrate temperature is a room temperature, a supplied radio frequency power is 800 W and an etching time is ten minutes. The temporary protective film 53 may be removed by wet etching.

With the temporary protective film 53 being removed, a heat treatment is performed for one hour in a nitrogen gas atmosphere at the substrate temperature of 300 to 400° C. This heat treatment improves the electrical characteristics of capacitors. Instead of the nitrogen gas atmosphere, the heat treatment may be performed in a different inert gas atmosphere or in a vacuum state.

As shown in FIG. 2C, the protective film 46 of silicon nitride is formed on the multi-wiring layer 52.

Figure 3A:
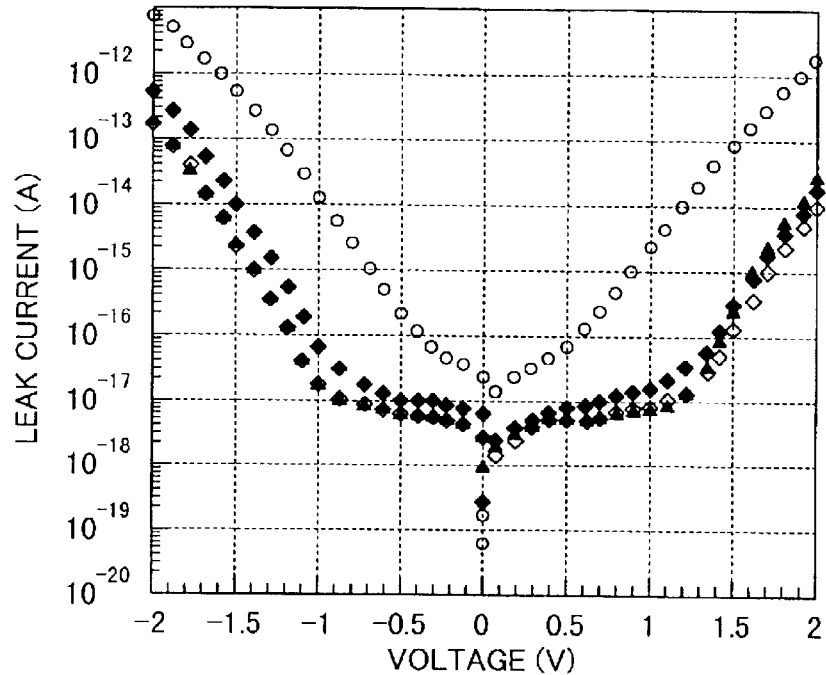
FIGS. 3A and 3B are graphs showing the current-voltage characteristics of capacitors of DRAM manufactured by the method of the first embodiment, as compared with the current-voltage characteristics of DRAM manufactured by a method of prior art.
Figure 3B:
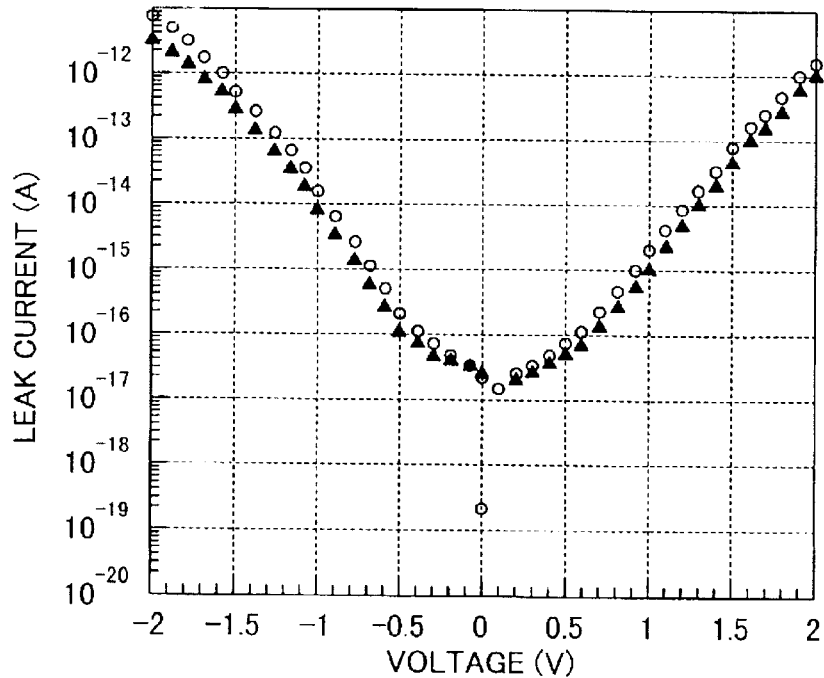
Figure 4:
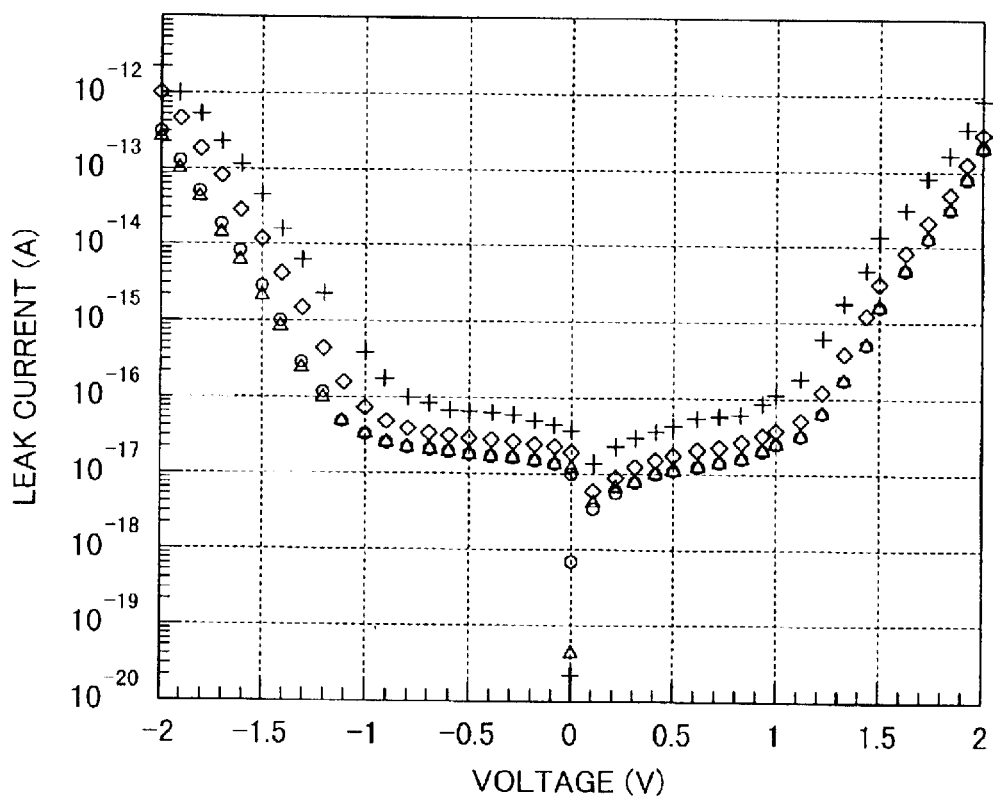
FIG. 4 is a graph showing the current-voltage characteristics of capacitors of DRAM manufactured by the method of the first embodiment, and the current-voltage characteristics of the capacitors after a heat treatment.

With reference to FIGS. 3A, 3B and 4, the effects of the DRAM manufacture method of the first embodiment will be described.

FIG. 3A shows the current-voltage characteristics of capacitors. The abscissa represents voltage applied to a capacitor in the unit of "V" and the ordinate represents leak current per each capacitor in the unit of "A". Black rhomboid symbols, white rhomboid symbols and black triangle symbols show the current-voltage characteristics of DRAM capacitors manufactured by the method of the first embodiment at the temperatures of 300° C., 350° C. and 400° C., respectively of the heat treatment in a nitrogen atmosphere for improving the capacitor characteristics. For comparison, the current-voltage characteristics of a DRAM capacitor manufactured by a prior art method are indicated by white circle symbols.

It can be seen that leak current of DRAM capacitors manufactured by the method of the first embodiment is smaller than DRAM capacitor manufactured by the prior art method. A larger leak current of the DRAM capacitor manufactured by the prior art method may be ascribed to that during the heat treatment in a hydrogen atmosphere for improving the transistor characteristics, tantalum oxide of the capacitor dielectric film is reduced so that oxygen vacancies are formed and lattice defects are formed in tantalum oxide.

With the method of the first embodiment, in the state shown in FIG. 2B that the protective film does not exist, the heat treatment is performed in an inert gas atmosphere or in a vacuum state. This heat treatment recovers crystallinity of tantalum oxide and the capacitor electrical characteristics are improved.

FIG. 3B shows the current-voltage characteristics of capacitors subjected to the heat treatment for improving the capacitor electrical characteristics, the heat treatment being performed with the protective film 46. White circle symbols indicate the current-voltage characteristics of the capacitor manufactured by the prior art method indicated by the white circle symbols in FIG. 3A. Black triangle symbols indicate the current-voltage characteristics of a capacitor after a heat treatment is performed in a nitrogen atmosphere at a temperature of 400 to 450° C. Even if the heat treatment is performed in the state that the protective film 46 exists, the capacitor electrical characteristics cannot be improved. This may be ascribed to that since hydrogen is contained in the protective film 46 of silicon nitride, hydrogen in the multi-wiring layer 52 is not eliminated even if the heat treatment is performed.

In the first embodiment, after the temporary protective film 53 once formed is removed, the heat treatment is performed so that hydrogen in the multi-wiring layer 52 can be eliminated and crystallinity of tantalum oxide can be recovered.

After the protective film 46 shown in FIG. 2C is formed, an assembly process is executed. In this assembly process, a heat treatment is performed in the state that the protective film 46 exists. There is some fear that hydrogen in the protective film 46 is diffused into the capacitor structure during this heat treatment and the capacitor electrical characteristics are degraded. The present inventors made evaluation experiments on whether the capacitor electrical characteristics are degraded by the assembly process.

FIG. 4 shows the results of evaluation experiments, the current-voltage characteristics of capacitors after the heat treatment. In FIG. 4, white circle symbols indicate the current-voltage characteristics of a DRAM capacitor manufactured by the method of the first embodiment. Plus symbols, rhomboid symbols and triangle symbols indicate the current-voltage characteristics of DRAM capacitors manufactured by the method of the first embodiment, after the heat treatment of one hour in a nitrogen atmosphere at temperatures of 400° C., 350° C. and 300° C., respectively.

At the heat treatment temperature of 300° C., leak current hardly increases. At the heat treatment temperature of 350° C., leak current increases little, and at the heat treatment temperature of 400° C., leak current increases further. Even at the heat treatment temperature of 400° C., leak current of the capacitor is smaller than the DRAM capacitor manufactured by the prior art method indicated by the white circle symbols in FIG. 3A.

As seen from the evaluation experiment results, it is possible to prevent deterioration of the capacitor electrical characteristics by setting the temperature of the heat treatment in the assembly process to 300° C. or lower, or more preferably 350° C. or lower. Junction leak current of DRAM manufactured by the method of the first embodiment was as small as that of DRAM manufactured by the prior art method.

Figure 5:
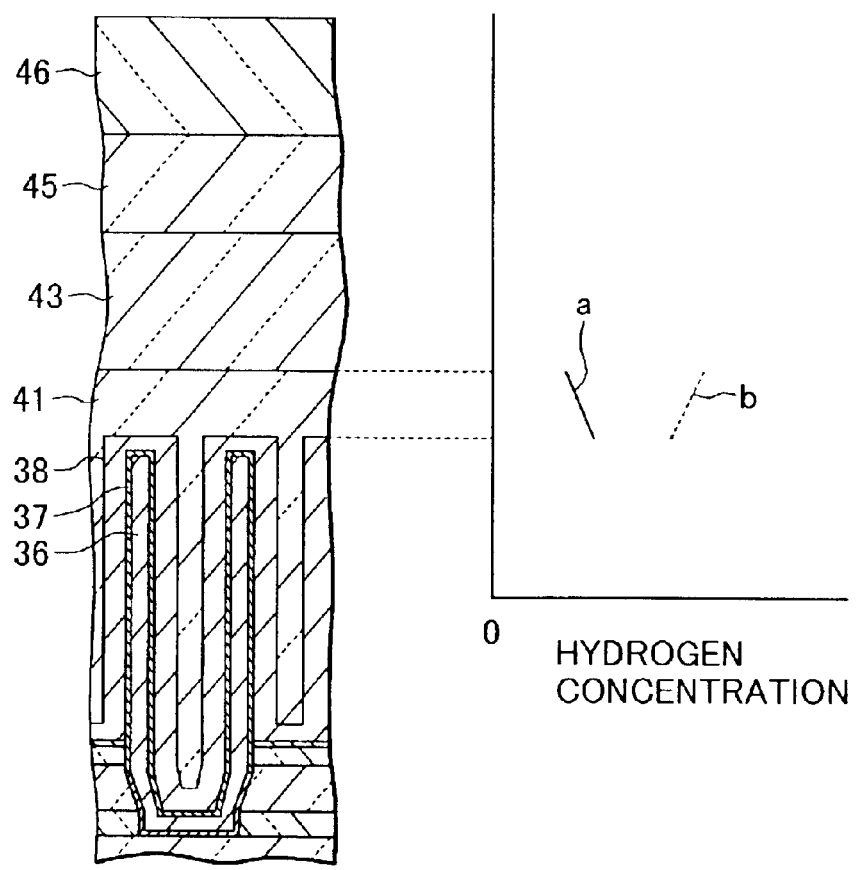
FIG. 5 is a graph showing the hydrogen concentration distribution in an interlayer insulating film above the capacitor of DRAM manufactured by the method of the first embodiment, as compared with the hydrogen concentration distribution in an interlayer insulating film above the capacitor of DRAM manufactured by the method of prior art.

FIG. 5 shows an example of hydrogen concentration distribution in the third interlayer insulating film 41 in its depth direction above the top surface of a DRAM capacitor formed by the method of the first embodiment. In the first embodiment, prior to forming the protective film 46, the heat treatment for hydrogen elimination is performed. Therefore, the hydrogen concentration in the third interlayer insulating film 41 gradually lowers at positions remoter from the substrate, as indicated by a solid line a.

In contrast, in the case of DRAM manufactured by the prior art method, hydrogen diffused during the heat treatment in the hydrogen atmosphere for improving the transistor performance is left in the third interlayer insulating film 41. The hydrogen concentration therefore gradually increases at positions remoter from the substrate, as indicated by a broken line b.

Next, with reference to FIGS. 6A to 6D, a DRAM manufacture method according to a second embodiment will be described.

Figure 6A:
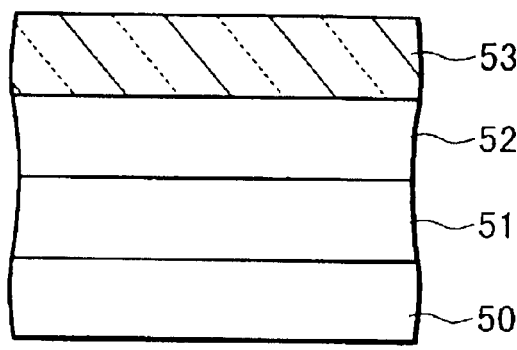
FIGS. 6A to 6D are schematic diagrams illustrating a semiconductor device manufacture method according to a second embodiment.
Figure 6B:
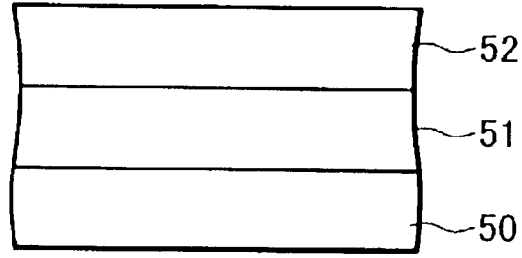

As shown in FIG. 6A, after a transistor layer 50, a capacitor layer 51 and a multi-wiring layer 52 are formed, a temporary protective layer 53 is formed on the multi-wiring layer. In this state, a heat treatment for improving the transistor performance is performed in a hydrogen atmosphere. As shown in FIG. 6B, after the temporary protective layer 63 is removed, a heat treatment for improving the capacitor electrical characteristics is performed. These processes are similar to those of the first embodiment described with reference to FIGS. 2A and 2B.

Figure 6C:
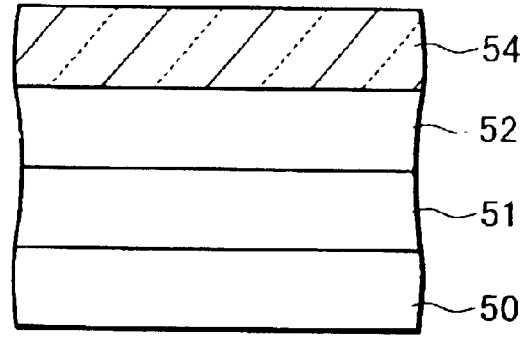

As shown in FIG. 6C, a hydrogen barrier layer 54 is formed on the multi-wiring layer 52. For example, the hydrogen barrier layer 54 is made of alumina ($Al_2O_3$) or tantalum oxide ($Ta_2O_5$). For example, the alumina film is formed by sputtering and the tantalum film is formed by CVD.

Figure 6D:
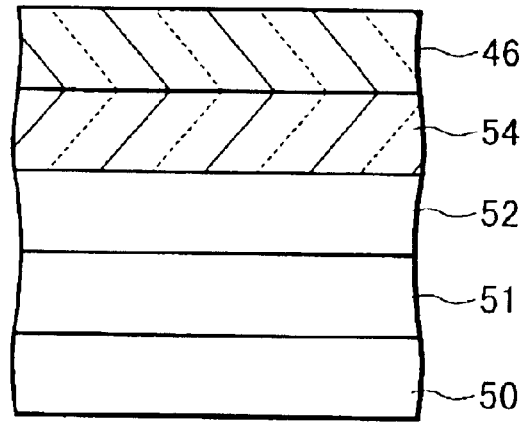

As shown in FIG. 6D, a protective film 46 is formed on the hydrogen barrier layer 54. The protective film 46 is formed by the same method as that used for forming the protective film 46 of the first embodiment.

In DRAM manufactured by the method of the second embodiment, the hydrogen barrier layer 54 is interposed between the protective film 46 and capacitor layer 51. Hydrogen in the protective film 46 can therefore be prevented from being diffused into the capacitor layer 51. In DRAM manufactured by the method of the first embodiment, an increase in capacitor leak current was observed as indicated by the plus symbols in FIG. 4 when the heat treatment at about 400° C. was performed after the protective film 46 was formed. In DRAM manufactured by the method of the second embodiment, since the hydrogen barrier layer 54 presents hydrogen from being diffused from the protective film 46 into the capacitor layer 51, it is expected that an increase in capacitor leak current is small even if a heat treatment at 400° C. or higher is performed.

Next, with reference to FIGS. 7A to 7C, a DRAM manufacture method according to a third embodiment will be described.

Figure 7A:
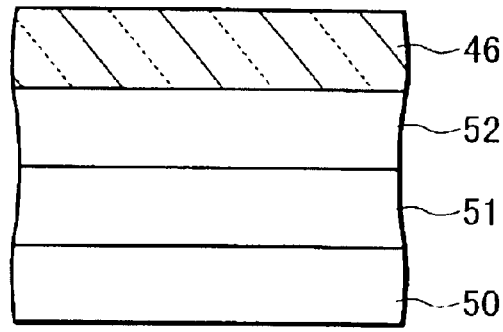
FIGS. 7A to 7C are schematic diagrams illustrating a semiconductor device manufacture method according to a third embodiment.

As shown in FIG. 7A, a transistor layer 50, a capacitor layer 51 and a multi-wiring layer 52 are formed. These processes are similar to those of the first embodiment described with reference to FIG. 2A. In the first embodiment although the temporary protective film 53 is formed on the multi-wiring layer 52, in the third embodiment a protective film 46 is formed which is not removed and maintained as the protective film of the final device. The protective film 46 is formed by a method similar to that used for forming the protective film 46 of the first embodiment shown in FIG. 2C.

In this state, a heat treatment for improving the transistor performance is performed. The heat treatment conditions are the same as those of the heat treatment for improving the transistor performance of the first embodiment described with reference to FIG. 2A.

Figure 7B:
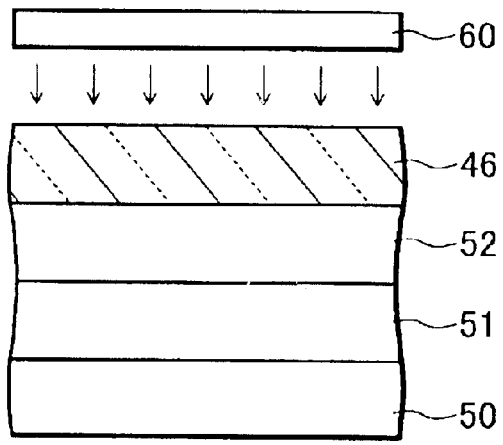

As shown in FIG. 7B, the surface of the protective film 46 is momentarily heated with a flash lamp 60 in a vacuum state or in a nitrogen atmosphere. The heating time is controlled so that the surface of the protective film 46 has a temperature of about 450 to 700° C. and the temperature at the interface between the protective film 46 and multi-wiring layer 52 is maintained about 400° C. or lower. For example, the heating time is in the order of millisecond or microsecond. This momentary heating can eliminate hydrogen in the protective film 46. With this method, since the multi-wiring layer 52 is maintained at 400° C. or lower, aluminum wiring or the like is not damaged.

Figure 7C:
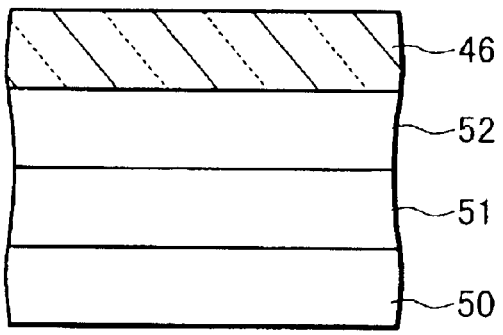

As shown in FIG. 7C, in the state that the protective film 46 subjected to the hydrogen elimination is left, a heat treatment for improving the capacitor electrical characteristics is performed. The heat treatment conditions are the same as those of the heat treatment for improving the capacitor electrical characteristics of the first embodiment described with reference to FIG. 2B. Since the protective film 46 covering the multi-wiring layer 52 was subjected to the hydrogen elimination process, hydrogen can be prevented from diffusing from the protective film 46 into the capacitor layer 51. In this manner, the capacitor electrical characteristics can be improved.

Figure 8A:
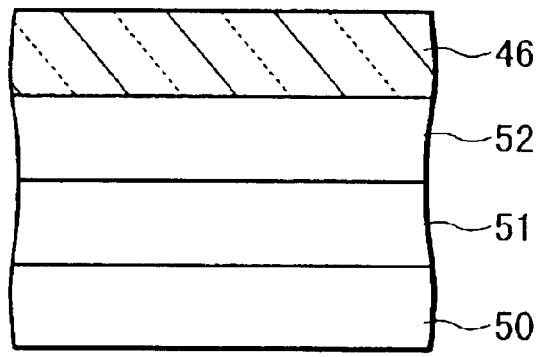
FIGS. 8A to 8C are schematic diagrams illustrating a semiconductor device manufacture method according to a fourth embodiment.
Figure 8B:
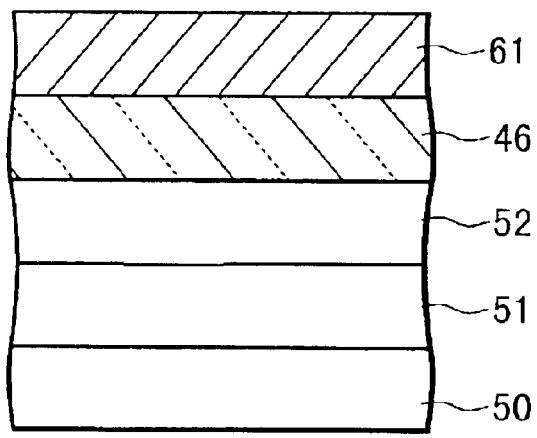
Figure 8C:
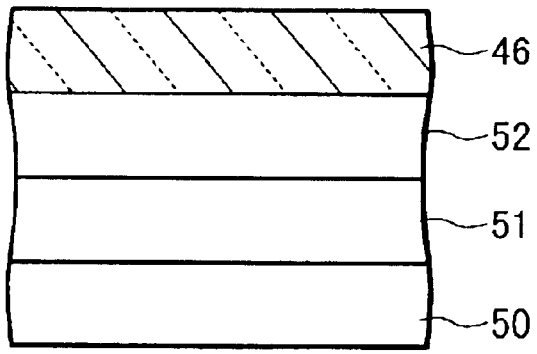

With reference to FIGS. 8A to 8C, a DRAM manufacture method according to a fourth embodiment will be described.

As shown in FIG. 8A, a transistor layer 50, a capacitor layer 51, a multi-wiring layer 52 and a protective layer 46 are formed. These processes are similar to those of the third embodiment described with reference to FIG. 7A. In this state, a heat treatment for improving the transistor performance is performed. The heat treatment conditions are the same as those of the heat treatment for improving the transistor performance of the first embodiment described with reference to FIG. 2A.

As shown in FIG. 8B, a titanium (Ti) layer 61 is formed on the protective film 46, for example, by sputtering. In this state, a heat treatment is performed for about one hour at 400° C. in a nitrogen atmosphere. Since titanium has an ability to getter hydrogen, hydrogen contained in the protective film 46 is absorbed in the titanium layer 61 so that hydrogen is suppressed from being diffused into the capacitor layer 51. This heat treatment can improve the capacitor electrical characteristics. In place of the titanium layer 61, a gettering layer made of material easier to getter hydrogen than the protective film 46 may be formed.

As shown in FIG. 8C, the titanium layer 61 is removed. Although the capacitor electrical characteristics are improved by the heat treatment for gettering hydrogen, if the degree of improvement is insufficient, a heat treatment for improving the capacitor electrical characteristics may be performed after the titanium layer 61 is removed.

Figure 9A:
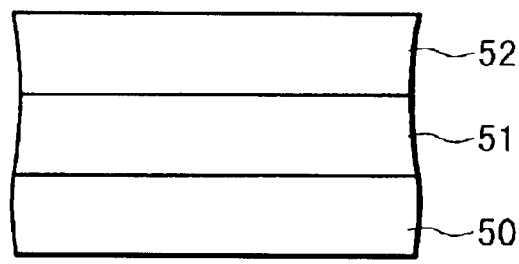
FIGS. 9A and 9B are schematic diagrams illustrating a semiconductor device manufacture method according to a fifth embodiment.
Figure 9B:
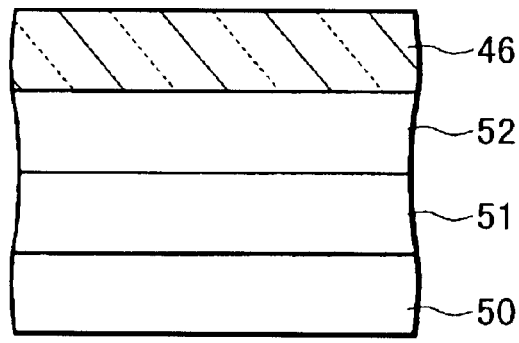

With reference to FIGS. 9A and 9B, a DRAM manufacture method according to a fifth embodiment will be described.

As shown in FIG. 9A, a transistor layer 50, a capacitor layer 51 and a multi-wiring layer 52 are formed. These processes are similar to those of the first embodiment described with reference to FIG. 2A. In this state, a heat treatment is performed in a hydrogen plasma atmosphere at 400 to 450° C. This heat treatment improves the transistor performance. However, since hydrogen diffuses to the capacitor layer 51, the capacitor electrical characteristic are degraded.

Before a protective film is formed, a heat treatment for improving the capacitor electrical characteristics is performed in a nitrogen atmosphere. The heat treatment conditions are the same as those of the heat treatment for improving the capacitor electrical characteristics of the first embodiment described with reference to FIG. 2B. Since the protective film is not formed, the capacitor electrical characteristics can be improved similar to the first embodiment.

As shown in FIG. 9B, a protective film 46 is formed on the multi-wiring layer 52. The protective film 46 is formed by the same method as that used for forming the protective film 46 of the first embodiment described with reference to FIG. 2C.

In the above-described embodiments, although tantalum oxide (TaO) is used as the material of the capacitor dielectric film, other materials may also be used such as PZT, BST, STO, HfO and ZrO.

The present invention has been described in connection with the preferred embodiments. The invention is not limited only to the above embodiments. It is apparent that various modifications, improvements, combinations, and the like can be made by those skilled in the art.

What we claim are:

1. A semiconductor device comprising:
   a transistor formed on a semiconductor substrate;
   a capacitor electrically connected to said transistor, said capacitor having two electrodes consisting of metal and a capacitor dielectric layer between the two electrodes consisting of oxide dielectric material;
   an interlayer insulating film formed on or over said capacitor and having a hydrogen concentration gradually lowering at positions remoter from said semiconductor substrate; and
   a protective film formed on or over said interlayer insulating film.

2. A semiconductor device according to claim 1, wherein the capacitor dielectric layer of said capacitor consists of tantalum oxide.

3. A semiconductor device according to claim 1, wherein said protective film consists of silicon nitride.

4. A semiconductor device comprising:
   a transistor formed on a semiconductor substrate;
   a capacitor electrically connected to said transistor, said capacitor having two electrodes consisting of metal and a capacitor dielectric layer between the two electrodes consisting of oxide dielectric material;
   an interlayer insulating film formed on or over said capacitor and having a hydrogen concentration gradually lowering at positions remoter from said semiconductor substrate;
   a protective film formed on or over said interlayer insulating film; and
   a hydrogen barrier layer formed between said interlayer insulating film and said protective film, said hydrogen barrier layer consisting of insulating material harder to transmit hydrogen than said protective film.

5. A semiconductor device according to claim 4, wherein the capacitor dielectric layer of said capacitor consists of tantalum oxide.

6. A semiconductor device according to claim 4, wherein said protective film consists of silicon nitride.

* * * * *